(12) United States Patent
Yokoi et al.

(10) Patent No.: US 10,916,439 B2
(45) Date of Patent: Feb. 9, 2021

(54) MASK-INTEGRATED SURFACE PROTECTIVE FILM

(71) Applicant: FURUKAWA ELECTRIC CO., LTD., Tokyo (JP)

(72) Inventors: Hirotoki Yokoi, Tokyo (JP); Tomoaki Uchiyama, Tokyo (JP); Yoshifumi Oka, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/868,791

(22) Filed: Jan. 11, 2018

(65) Prior Publication Data

US 2018/0158691 A1 Jun. 7, 2018

Related U.S. Application Data

(63) Continuation of application No. PCT/JP2016/082984, filed on Nov. 7, 2016.

(30) Foreign Application Priority Data

Nov. 9, 2015 (JP) .................................. 2015-219735

(51) Int. Cl.
*H01L 21/3105* (2006.01)
*H01L 21/304* (2006.01)
(Continued)

(52) U.S. Cl.
CPC ........ *H01L 21/31058* (2013.01); *B23K 26/38* (2013.01); *H01L 21/02076* (2013.01); *H01L 21/304* (2013.01); *H01L 21/3065* (2013.01); *H01L 21/6836* (2013.01); *H01L 21/78* (2013.01); *H01L 2221/6834* (2013.01); *H01L 2221/68327* (2013.01); *H01L 2221/68381* (2013.01)

(58) Field of Classification Search
CPC ......... H01L 21/31058; H01L 21/02076; H01L 21/304; H01L 21/78
See application file for complete search history.

(56) References Cited

U.S. PATENT DOCUMENTS

2008/0039583 A1 2/2008 Lee et al.
2009/0004780 A1 1/2009 Arita et al.
(Continued)

FOREIGN PATENT DOCUMENTS

CN 101495588 A 7/2009
CN 202742785 U 2/2013
(Continued)

OTHER PUBLICATIONS

Taiwanese Office Action issued in Taiwanese Patent Appiication No. 10720134010 dated Feb. 12, 2018, with English translation.
(Continued)

*Primary Examiner* — Seahvosh Nikmanesh
(74) *Attorney, Agent, or Firm* — Birch, Stewart, Kolasch & Birch, LLP

(57) ABSTRACT

A mask-integrated surface protective film, containing:
a substrate film, and
a mask material layer provided on the substrate film;
wherein the mask material layer is an ethylene-vinyl acetate copolymer resin, an ethylene-methyl acrylate copolymer resin, or an ethylene-butyl acrylate copolymer resin; and wherein the thickness of the mask material layer is 50 μm or less.

12 Claims, 6 Drawing Sheets

(51) Int. Cl.
*H01L 21/3065* (2006.01)
*B23K 26/38* (2014.01)
*H01L 21/02* (2006.01)
*H01L 21/683* (2006.01)
*H01L 21/78* (2006.01)

(56) References Cited

U.S. PATENT DOCUMENTS

| | | |
|---|---|---|
| 2010/0022071 A1 | 1/2010 | Arita et al. |
| 2010/0173474 A1 | 7/2010 | Arita et al. |
| 2011/0281509 A1 | 11/2011 | Tanaka et al. |
| 2012/0322237 A1 | 12/2012 | Lei et al. |
| 2012/0322239 A1 | 12/2012 | Singh et al. |

FOREIGN PATENT DOCUMENTS

| | | |
|---|---|---|
| CN | 203833944 U | 9/2014 |
| CN | 105008481 A | 10/2018 |
| EP | 2975098 A1 | 1/2016 |
| JP | 2007-019385 A | 1/2007 |
| JP | 2008-098228 A | 4/2008 |
| JP | 2008-193034 A | 8/2008 |
| JP | 2008-226940 A | 9/2008 |
| JP | 2009-033155 A | 2/2009 |
| JP | 2009-33156 A | 2/2009 |
| JP | 2009-141024 A | 6/2009 |
| JP | 2013-157589 A | 8/2013 |
| JP | 2013-225647 A | 10/2013 |
| JP | 2014-523116 A | 9/2014 |
| JP | 2015-050333 A | 3/2015 |
| WO | WO 2012/017568 A | 2/2012 |
| WO | WO 2014/142085 A1 | 8/2013 |

OTHER PUBLICATIONS

Extended European Search Report, dated Apr. 8, 2019, for European Application No. 16864172.8.
International Search Report for PCT/JP2016/082984 (PCT/ISA/210) dated Jan. 24, 2017.
Written Opinion of the International Searching Authority for PCT/JP2016/082984 (PCT/ISA/237) dated Jan. 24, 2017.
Chinese Office Action and Search Report, dated Jan. 6, 2020 for Chinese Application No. 201680024338.8, with an English translation of the Chinese Office Action.
Japanese Office Action, dated Sep. 15, 2020, for Japanese Application No. 2017-528231, with an English machine translation.
Chinese Office Action and Search Report, dated Jul. 14, 2020, for Chinese Application No. 201680024338.8, with an English translation of the Chinese Office Action.

MASK-INTEGRATED SURFACE PROTECTIVE FILM

CROSS-REFERENCE TO RELATED APPLICATIONS

This application is a Continuation of PCT International Application No. PCT/JP2016/082984 filed on Nov. 7, 2016, which claims priority under 35 U.S.C. § 119 (a) to Japanese Patent Application No. 2015-219735 filed in Japan on Nov. 9, 2015. Each of the above applications is hereby expressly incorporated by reference, in its entirety, into the present application.

TECHNICAL FIELD

The present invention relates to mask-integrated surface protective film.

BACKGROUND ART

In recent years, remarkable evolution has made on the thinning of the semiconductor chip and the downsizing of the chip. In particular, the thinning is required in the IC cards with built-in semiconductor IC chips, such as a memory card and a smart card. Further, the downsizing of the chip is required in LED or LCD driving devices and the like. With the increase in these demands from now, the needs for the thinning of the semiconductor chip and the downsizing of the chip are thought of as being increased much more.

These semiconductor chips are obtained, by thinning a semiconductor wafer to a predetermined thickness in the backgrinding step, an etching step or the like, and then dividing the semiconductor wafer into individual chips through a dicing step. In this dicing step, a blade dicing method of cutting the semiconductor wafer with a dicing blade has been used. In this blade dicing method, the cutting resistance by the blade is put directly on the semiconductor wafer at the time of cutting, so that a microscopic crack (or chipping) sometimes occurs in the semiconductor chip by this cutting resistance. Occurrence of the chipping does not only deteriorate outer appearance of the semiconductor chip, but also in some cases, there is a risk that even a circuit pattern on the chip is damaged, for example, a damage of chips is occurred due to lack (or insufficiency) of the transverse strength (or deflective strength) at the time of picking up. Further, in the foregoing physical dicing step using such a blade, it is impossible to set the width of a kerf (also referred to as a scribe line or a street) which is an interval between chips to less than the thick blade width. As a result, the number (yield) of chips gotten from a sheet of wafer decreases. Further, a long time period to be taken for the processing of the wafer is also a problem.

In the dicing step, use is also made of any of various kinds of methods, other than the blade dicing method. There is a DBG (i.e. dicing before grinding) method of, in view of the difficulty in carrying out the dicing after the thinning of the wafer, forming in first a groove with a predetermined thickness in the wafer, and then carrying out a grinding step, and thereby for achieving both the thinning and the singulation into chips at the same time. By using this method, the kerf width is similar to that in the blade dicing method. However, this method has the advantage that the transverse strength of the chip is increased, so that a damage of the chip can be suppressed.

Further, there is a laser dicing method of carrying out a dicing step with a laser. The laser dicing method has an advantage of being able to narrow a kerf width and also to conduct the dicing in dry process. However, there is a disadvantage that a wafer surface is contaminated with a sublimate at the time of cutting with a laser. For this reason, the wafer surface sometimes necessitates being subjected to a pretreatment of protecting it with a predetermined liquid protecting material. Further, the foregoing dry process has not yet led to achievement of a complete dry process. Further, the laser dicing method allows a further speeding-up of the processing rate, compared to the blade dicing method. However, the laser dicing method remains unchanged in carrying out a processing along every one line, and therefore it takes a certain time period for producing an extremely small chip.

In a case of using a wet process, such as a water-jet method of carrying out a dicing step with a water pressure, there is a possibility that a problem occurs in the material which is sensitive to a surface contamination, such as an MEMS device, a CMOS sensor, and the like. There is also a disadvantage that narrowing of a kerf width is limited, so that a chip yield is low.

The stealth dicing method of forming a modifying layer with a laser in the thickness direction of the wafer, and then splitting the modifying layer by expansion to singulate the wafer, has the advantage that a kerf width can be reduced to zero and a processing can be carried out in a dry state. However, a transverse strength of the chip tends to be decreased by the thermal history at the time of forming the modifying layer. Further, silicon debris sometimes occurs at the time of splitting the modifying layer by expansion. Further, there is a risk that the collision of each adjacent chips may be bring about short (or insufficiency) of the transverse strength.

Further, as a combined method of the stealth dicing and the dicing before grinding, there is a chip-singulation method corresponding to a narrow scribe width, which forms in first a modifying layer with only a predetermined width prior to the thinning, and then carrying out a grinding step from the backing-face side, thereby for achieving the thinning and the singulation into chips at the same time. This technique improves the disadvantages of the above mentioned process, and has the advantage that a kerf width is zero and a chip yield is high and also a transverse strength is increased, because a silicon modifying layer is cleaved and singulated by a stress in the wafer backgrinding step. However, because singulation is performed in the backgrinding step, a phenomenon is sometimes occurred, in which an end side of the chip collides with an adjacent chip, and thereby that the chip corner is chipped.

Further, a technology of a plasma dicing method has been proposed (for example, see Patent Literature 1). The plasma dicing method is a method of dividing a semiconductor wafer, by selectively etching a portion which is not covered with a mask, using plasma. When this dicing method is used, segmentation of chips can be achieved selectively, and even if the scribe line is curved, the segmentation is possible with no trouble. Further, as the etching rate of the semiconductor wafer is very high, in recent years, this dicing method is considered one of the most suitable steps for the segmentation into chips.

CITATION LIST

Patent Literatures

Patent Literature 1: JP-A-2007-19385 ("JP-A" means unexamined published Japanese patent application)

SUMMARY OF INVENTION

Technical Problem

In the plasma dicing method, use is made of, as a plasma generating gas, a fluorine-based gas which has a very high reactivity with a wafer, such as sulfur hexafluoride ($SF_6$) and carbon tetrafluoride ($CF_4$). For this reason, a protection for a non-etched surface with a mask against such high etching rate is necessary. Therefore, a preliminary mask formation becomes necessary.

In order to form the mask, as described in Patent Literature 1, generally the technique is used which consists of: coating a resist on the surface of the wafer; and then removing the portion corresponding to a street by a photolithography, to form the mask. Therefore, in order to carry out the plasma dicing, it is required for a facility for the photolithographic step other than the plasma dicing facility. For this reason, there is a problem of increase in chip costs. Further, because of being in a state that a resist film is remaining after the plasma-etching, it is necessarily to use a large amount of solvent to remove the resist. In the case, if the resist is not able to be removed, there may be a risk that the remained resist act as an adhesive deposit, which results in occurrence of a defective chip. Further, there is also a disadvantage that an overall processing process gets longer period, because of undergoing a masking step with a resist.

The present invention is contemplated to provide a mask-integrated surface protective film, which does not need a mask formation by a photolithography process in the production of a semiconductor chip using a plasma dicing method, and which, by laminating it on a patterned surface of the semiconductor wafer, is able to protect effectively the patterned surface due to a good adhesion to the patterned surface in the thinning step (backgrinding step) of the semiconductor wafer, and which has a good peeling property between a mask material layer and a substrate film after the thinning step, whereby the mask material layer can be easily exposed on top of the semiconductor wafer, and which allows dicing of the wafer into chips with more certainty and high precision by a $SF_6$ plasma, and further which allows removal of the mask material with more certainty in a short time by an $O_2$ plasma after the plasma dicing (after division of the wafer), whereby occurrence of defective chips can be highly prevented.

Solution to Problem

The above-described problems of the present invention can be solved by the following means.

[1] A mask-integrated surface protective film, containing:
a substrate film, and
a mask material layer provided on the substrate film;
wherein the mask material layer is an ethylene-vinyl acetate copolymer resin, an ethylene-methyl acrylate copolymer resin, or an ethylene-butyl acrylate copolymer resin; and
wherein the thickness of the mask material layer is 50 µm or less.

[2] The mask-integrated surface protective film described in the above item [1], wherein the substrate film is a polystyrene resin.

[3] The mask-integrated surface protective film described in the above item [1],
wherein the substrate film is a single-layered and cured acrylic resin film, and wherein the thickness of the mask material layer is 10 µm or less.

[4] The mask-integrated surface protective film described in the above item [1],
wherein the substrate film is multilayered,
wherein, of the substrate film, a layer placed at the distance farthest from the mask material layer is a high elastic modulus layer and a layer placed at the distance nearest from the mask material layer is a low elastic modulus layer, and wherein the thickness of the mask material layer is 10 µm or less.

[5] The mask-integrated surface protective film described in the above item [4], wherein the low elastic modulus layer is an ethylene-vinyl acetate copolymer resin, an ethylene-methyl acrylate copolymer resin, or an ethylene-butyl acrylate copolymer resin.

[6] The mask-integrated surface protective film described in any one of the above items [1] to [5], wherein the ethylene content rate of the ethylene-vinyl acetate copolymer resin, ethylene-methyl acrylate copolymer resin, or ethylene-butyl acrylate copolymer resin is from 50 to 80% by weight.

[7] The mask-integrated surface protective film described in any one of the above items [1] to [6], which is used for a plasma dicing.

[8] A mask-integrated surface protective film used in a production of a semiconductor chip containing the following steps (a) to (d), wherein the mask-integrated surface protective film has a substrate film and a mask material layer provided on the substrate film, and the thickness of the mask material layer is 50 µm or less:

(a) a step of, in the state of having laminated a mask-integrated surface protective film on the side of a patterned surface of a semiconductor wafer, grinding the backing-face of the semiconductor wafer; laminating a wafer fixing tape on the backing-face side of the ground semiconductor wafer; and supporting and fixing the wafer to a ring flame;

(b) a step of, after peeling the substrate film from the mask-integrated surface protective film thereby to expose the mask material layer on top, forming an opening by cutting a portion of the mask material layer corresponding to a street of the semiconductor wafer with a laser; or a step of, after forming an opening at a street of the semiconductor wafer by a laser cutting of a portion of the mask-integrated surface protective film corresponding to the street of the semiconductor wafer, exposing the mask material layer on top by peeling the substrate film from the mask-integrated surface protective film;

(c) a plasma-dicing step of segmentalizing the semiconductor wafer at the street with $SF_6$ plasma, and thereby for singulating the semiconductor wafer into semiconductor chips; and (d) an ashing step of removing the mask material layer with $O_2$ plasma.

[9] The mask-integrated surface protective film described in the above item [8], wherein the mask material layer is an ethylene-vinyl acetate copolymer (EVA) resin, an ethylene-methyl acrylate copolymer (EMA) resin, or an ethylene-butyl acrylate copolymer (EBA) resin.

[10] The mask-integrated surface protective film described in the above item [8] or [9],
wherein the substrate film is a polystyrene resin, and wherein the lamination of the mask-integrated surface protective film on the side of the patterned surface of the semiconductor wafer in the above-described step (a) is a heat lamination within a range of 50° C. to 100° C.

[11] The mask-integrated surface protective film described in the above item [8] or [9],
wherein the substrate film is a single-layered and cured acrylic resin film, and wherein the thickness of the mask material layer is 10 µm or less.

[12] The mask-integrated surface protective film described in the above item [8] or [9], wherein the substrate film is multilayered, wherein, of the substrate film, a layer placed at the distance farthest from the mask material layer is a high elastic modulus layer and a layer placed at the distance nearest from the mask material layer is a low elastic modulus layer, and wherein the thickness of the mask material layer is 10 µm or less.

[13] The mask-integrated surface protective film described in the above item [12], wherein the low elastic modulus layer is an ethylene-vinyl acetate copolymer (EVA) resin, an ethylene-methyl acrylate copolymer (EMA) resin, or an ethylene-butyl acrylate copolymer (EBA) resin.

[14] The mask-integrated surface protective film described in the above item [9] or [13], wherein the ethylene content rate of the EVA resin, EMA resin, or EBA resin is from 50 to 80% by weight.

Advantageous Effects of Invention

The mask-integrated surface protective film of the present invention is a surface protective film which is able to eliminate the need for a mask formation by a photolithography process in producing the semiconductor chip using a plasma dicing method. According to the mask-integrated surface protective film of the present invention, by laminating it on a patterned surface of the semiconductor wafer, the patterned surface can be protected effectively due to a good adhesion to the patterned surface in the thinning step of the wafer. The mask-integrated surface protective film of the present invention has a good peeling property between a mask material layer and a substrate film after the above-described thinning step, whereby the mask material layer can be easily exposed on top of the wafer, which allows dicing of the wafer into chips with more certainty and high precision by $SF_6$ plasma. Further, the mask material layer exposed on top of the wafer can be removed by $O_2$ plasma with more certainty in a short time. As a result, by processing the semiconductor wafer using the mask-integrated surface protective film of the present invention, the occurrence of defective chips can be highly prevented.

Other and further features and advantages of the invention will appear more fully from the following description, appropriately referring to the accompanying drawings.

BRIEF DESCRIPTION OF THE DRAWINGS

FIG. 1(a) shows a semiconductor wafer, fragmentary FIG. 1(b) shows how the mask-integrated surface protective film is laminated onto the semiconductor wafer, and fragmentary FIG. 1(c) shows a semiconductor wafer on which the mask-integrated surface protective film is laminated.

FIG. 2(a) shows thinning step of the semiconductor wafer, fragmentary FIG. 2(b) shows how a wafer-fixing tape is laminated to the thinning processed semiconductor wafer, and fragmentary FIG. 2(c) shows a state in which the semiconductor wafer is fixed to a ring flame.

FIG. 3(a) shows how the substrate film is peeled off from the mask-integrated surface protective film while leaving the mask material layer, fragmentary FIG. 3(b) shows a state in which the mask material layer of the mask-integrated surface protective film is exposed (uncovered), and fragmentary FIG. 3(c) shows a step of cutting off the mask material layer corresponding to the street with a laser.

FIG. 4(a) shows how the plasma dicing is carried out, fragmentary FIG. 4(b) shows a state in which the semiconductor wafer is singulated into chips, and fragmentary FIG. 4(c) shows how the plasma ashing is carried out.

FIG. 5(a) shows a state, in which the mask material layer is removed, and fragmentary FIG. 5(b) shows how the chip is picked up.

FIG. 6(a) shows a state in which both sides of the front and the back of the semiconductor wafer are covered and fixed with the mask-integrated surface protective film and the wafer-fixing tape, respectively, fragmentary FIG. 6(b) shows a step of cutting off the substrate film and mask material layer corresponding to the street portion with a laser, and fragmentary FIG. 6(c) shows how the substrate film is peeled off from the mask-integrated surface protective film while leaving the mask material layer.

MODE FOR CARRYING OUT THE INVENTION

Figure 1A:
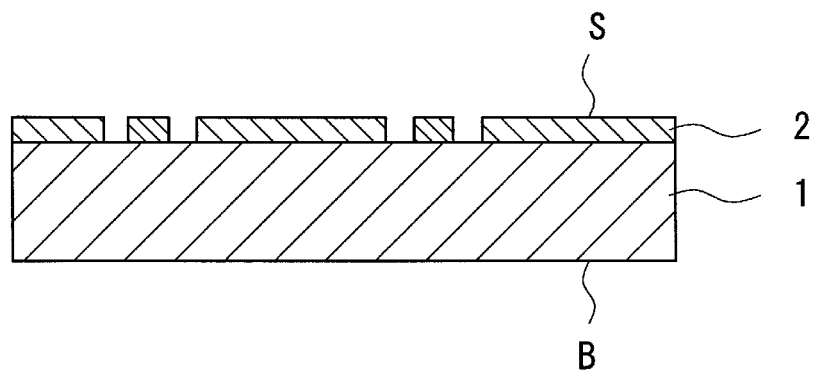
FIGS. 1(a) to 1(c) are schematic cross-sectional views illustrating steps to laminating a surface protective tape onto a semiconductor wafer in the first embodiment using the mask-integrated surface protective film of the present invention. In the views, fragmentary
Figure 1B:
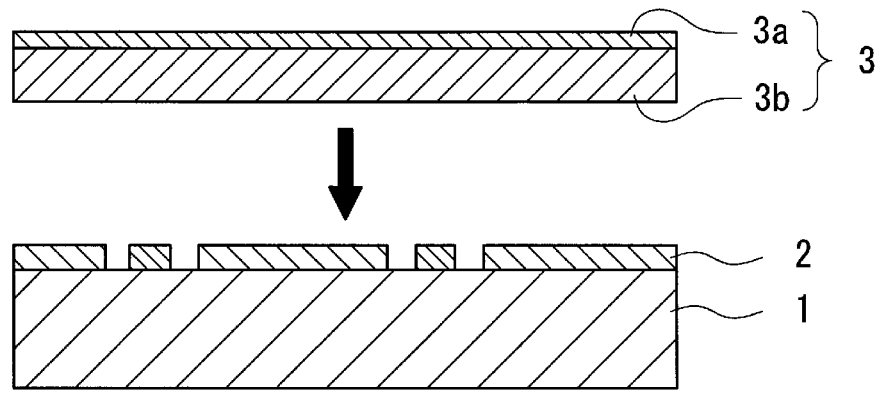
Figure 1C:
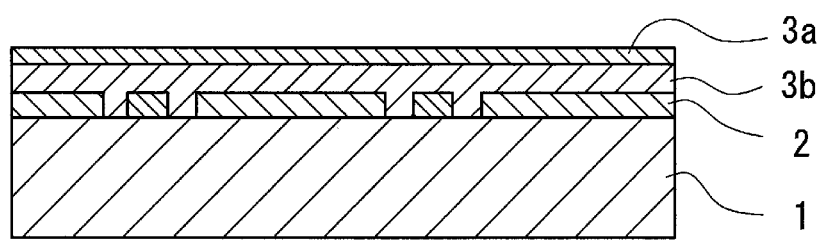

The mask-integrated surface protective film of the present invention is preferably used in a method of obtaining a semiconductor chip by plasma dicing a semiconductor wafer. As described below, by using the mask-integrated surface protective film of the present invention, a photolithography process prior to the plasma dicing step becomes unnecessary, whereby production costs of the semiconductor chips and the semiconductor products can be largely suppressed.

The mask-integrated surface protective film of the present invention has a substrate film and a mask material layer provided on the substrate film, and the thickness of the mask material layer is 50 µm or less. The mask-integrated surface protective film of the present invention is preferably used in the production of the semiconductor chip containing at least the following steps (a) to (d):

(a) a step of, in the state of having laminated a mask-integrated surface protective film on the side of a patterned surface of a semiconductor wafer, grinding the backing-face of the semiconductor wafer; laminating a wafer fixing tape on the backing-face side of the ground semiconductor wafer; and supporting and fixing the wafer to a ring flame;

(b) a step of, after peeling the substrate film from the mask-integrated surface protective film thereby to expose the mask material layer on top, forming an opening by cutting a portion of the mask material layer corresponding to a street of the semiconductor wafer with a laser; or a step of, after forming an opening at a street of the semiconductor wafer by a laser cutting of a portion of the mask-integrated surface protective film corresponding to the street of the semiconductor wafer, exposing the mask material layer on top by peeling the substrate film from the mask-integrated surface protective film;

(c) a plasma-dicing step of segmentalizing the semiconductor wafer at the street with $SF_6$ plasma, and thereby for singulating the semiconductor wafer into semiconductor chips; and (d) an ashing step of removing the mask material layer with $O_2$ plasma.

In the method of producing a semiconductor chip applied by the mask-integrated surface protective film of the present invention, the following step (e), after the step (d), is preferably included. When the production method includes following step (e), the following step (f) is preferably included after the step (e).

(e) A step of picking up the semiconductor chip from the wafer-fixing tape, (f) A step of transiting the picked-up semiconductor chip to a die bonding step.

The mask-integrated surface protective film of the present invention has a substrate film and a mask material layer provided on the substrate film, as described above. In the present specification, only the substrate film is sometimes called as "a surface protective tape". In other words, the mask-integrated surface protective film of the present invention is a film having a laminated structure in which the mask material layer has been provided on the surface protective tape (substrate film layer).

Regarding the production method of the semiconductor chip using the mask-integrated surface protective film of the present invention (hereinafter, referred to simply as "a production method applied by the present invention"), a preferable embodiment thereof is described below with reference to drawings. However, the present invention is not limited to the following embodiments, except for the prescription of the present invention. Further, the form shown in each drawing is a schematic view for facilitating the understanding of the present invention. Therefore, regarding the size, the thickness, the relative magnitude relation and the like of each component, the large one or the small one is sometimes changed for the purpose of illustration, and the form does not show a real relation as it is. Further, the present invention is not limited to outer forms and shapes shown in these figures, except for the requirements defined by the present invention.

Preferable embodiments of the production method applied by the present invention may be classified into first and second embodiments, as described below.

Note that, as the apparatus, the materials and the like used in the following embodiments, an ordinary apparatus, materials and the like which have been conventionally used in the processing of the semiconductor wafer may be used, unless otherwise indicated, and the conditions of use for them can be appropriately set and optimized in accordance with the intended use within a range of an ordinary method for using. Further, omitted are duplicated descriptions about the materials, structures, methods, effects, and the like, which are common to each embodiment.

First Embodiment [FIG. 1 to FIG. 5]

The first embodiment of a production method applied by the present invention is described with reference to FIG. 1 to FIG. 5.

A semiconductor wafer 1 has a patterned face 2 on the surface S of which a circuit or the like of the semiconductor device is formed (see FIG. 1(a)). On this patterned surface 2, a mask-integrated surface protective film 3 in which a mask material layer 3b has been provided on a substrate film 3a, is laminated (see FIG. 1 (b)), whereby a semiconductor wafer 1 whose patterned surface 2 is covered with the mask-integrated surface protective film 3 of the present invention is obtained (see FIG. 1 (c)).

Figure 2A:
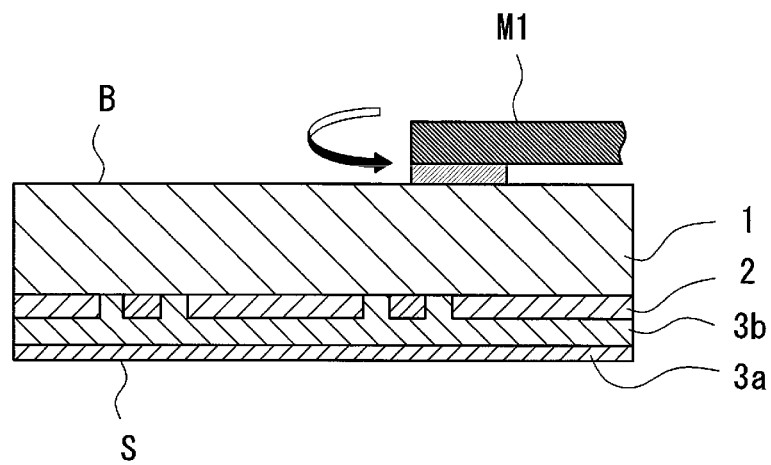
FIGS. 2(a) to 2(c) are schematic cross-sectional views illustrating steps to thinning and fixing of the semiconductor wafer in the first embodiment using the mask-integrated surface protective film of the present invention. In the views, fragmentary
Figure 2B:
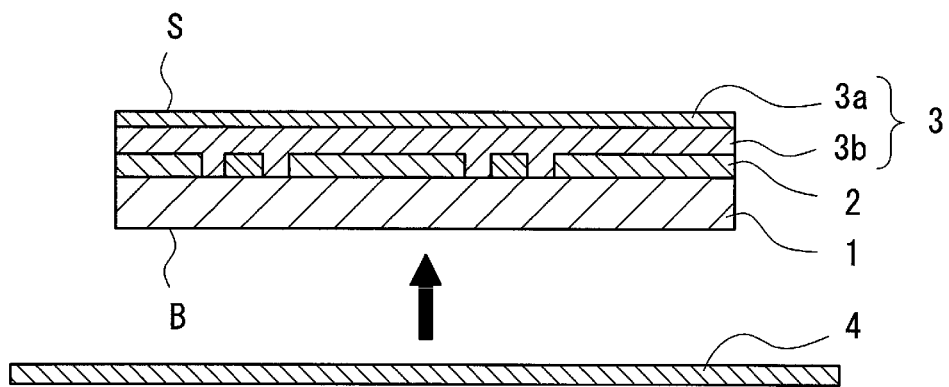

Then, the backing-face B of the semiconductor wafer 1 is ground by a wafer-grinding apparatus M1, to thin a thickness of the semiconductor wafer 1 (see FIG. 2(a)). On the ground backing-face B, a wafer-fixing tape 4 is laminated (see FIG. 2(b)), to support and fix the wafer to a ring flame F (see FIG. 2(c)).

Figure 3A:
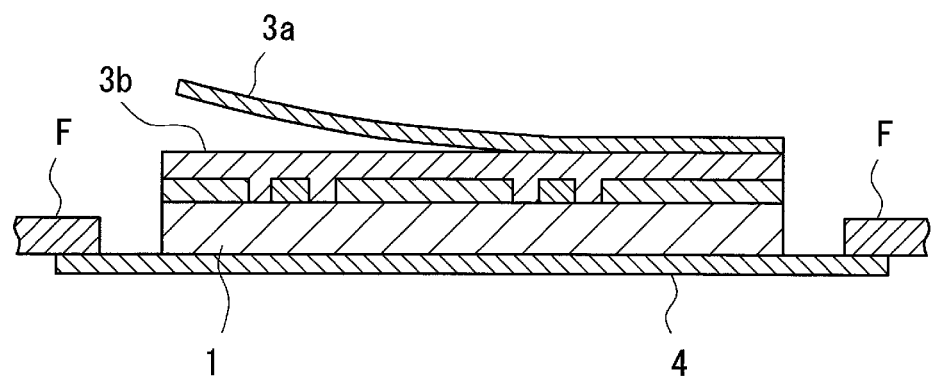
FIGS. 3(a) to 3(c) are schematic cross-sectional views illustrating steps to the mask formation in the first embodiment using the mask-integrated surface protective film of the present invention. In the views, fragmentary
Figure 3B:
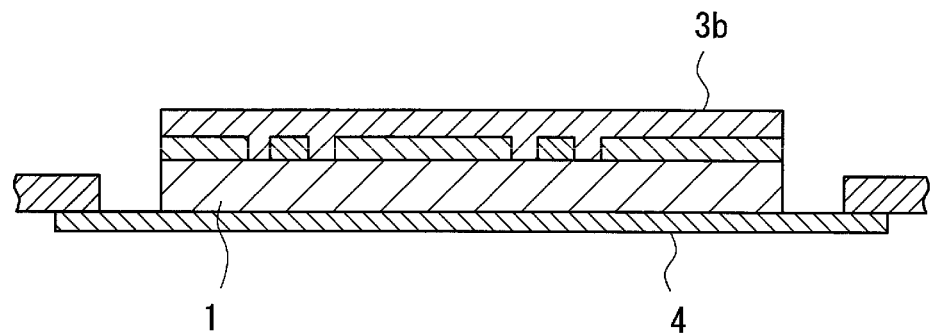
Figure 3C:
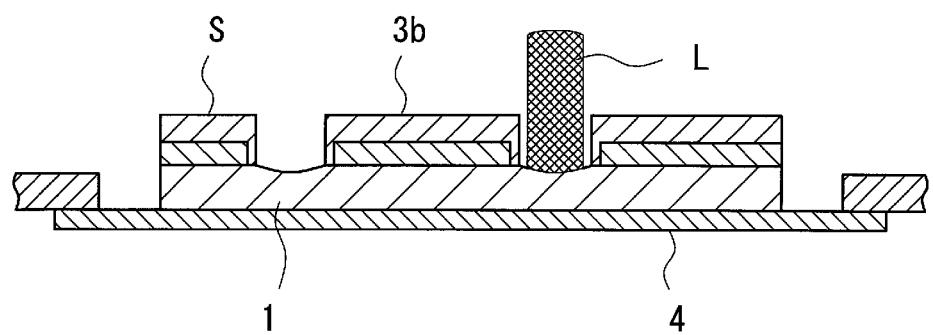

The substrate film 3a of the mask-integrated surface protective film 3 is peeled off from the semiconductor wafer 1, while leaving the mask material layer 3b on the semiconductor wafer 1 (see FIG. 3(a)), so that the mask material layer 3b is exposed (uncovered) (see FIG. 3(b)). Further, $CO_2$ laser L is irradiated from the surface S side toward a plurality of streets (not shown) appropriately formed in a grid pattern or the like onto the patterned face 2, thereby to remove a portion corresponding to a street of the mask material layer 3b, so that streets of the semiconductor wafer are opened (see FIG. 3(c)).

Figure 4A:
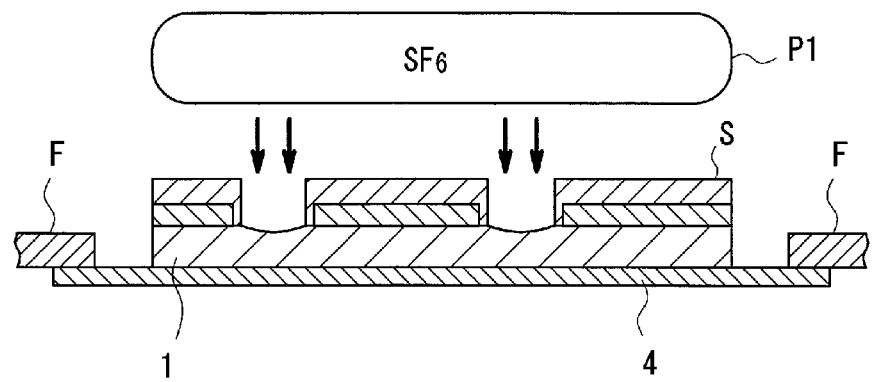
FIGS. 4(a) to 4(c) are schematic cross-sectional views illustrating the plasma dicing and plasma ashing steps in the first embodiment using the mask-integrated surface protective film of the present invention. In the views, fragmentary
Figure 4B:
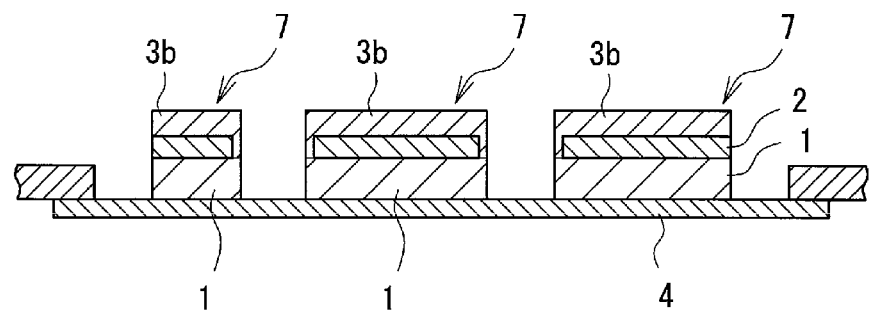
Figure 4C:
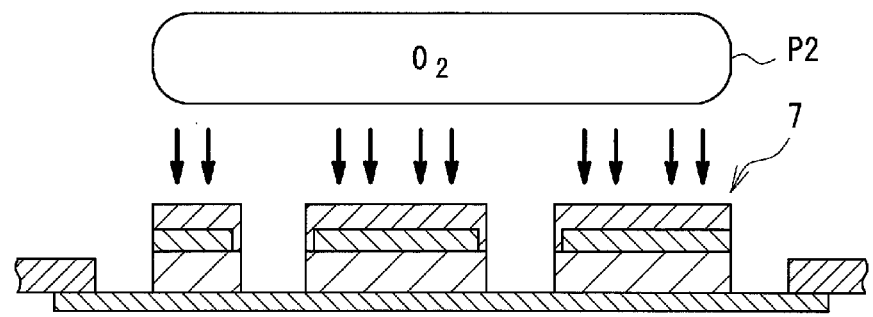
Figure 5A:
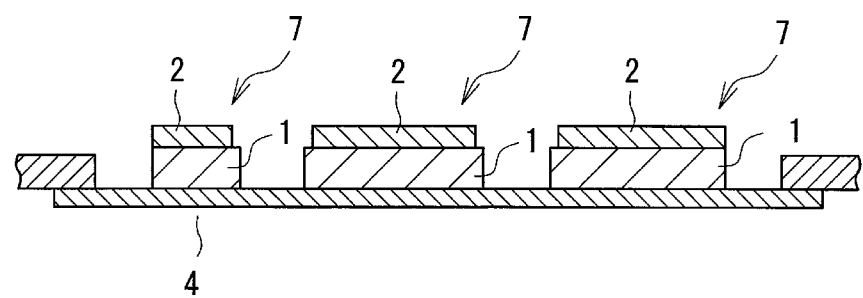
FIGS. 5(a) and 5(b) are schematic cross-sectional views illustrating steps to picking up a chip in the first embodiment using the mask-integrated surface protective film of the present invention. In the views, fragmentary
Figure 5B:
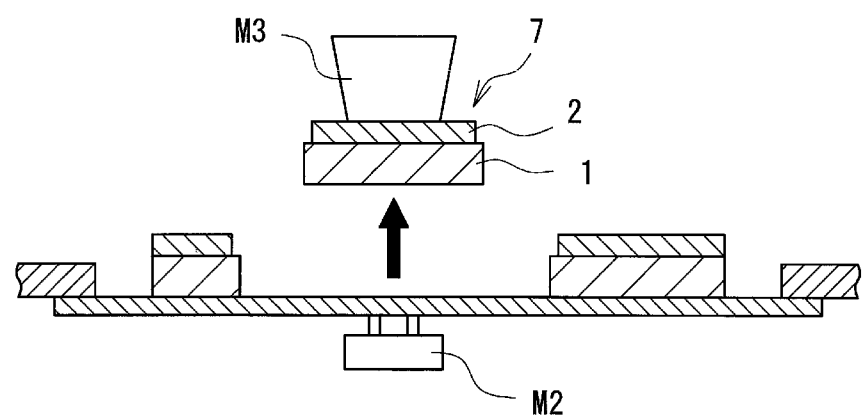

Then, a treatment with the plasma P1 of $SF_6$ gas is carried out from the surface S side, thereby to etch the semiconductor wafer 1 which is exposed at the street portion (see FIG. 4(a)), and the semiconductor wafer is divided into individual chips 7, which results in singulation (see FIG. 4(b)). After that, ashing with the plasma P2 of $O_2$ gas is carried out (see FIG. 4(c)), thereby to remove the mask material layer 3b remaining on the surface S (see FIG. 5(a)). Then, at last, the singulated chip 7 is knocked up by a pin M2, and is picked up by adsorption with a collet M3 (see FIG. 5(b)).

Herein, a process of etching of Si of the semiconductor wafer with the use of $SF_6$ gas is also called as a BOSCH process. This process allows a reaction of the exposed Si and a fluorine atom formed from a plasmarized $SF_6$, thereby to remove the exposed Si as silicon tetrafluoride ($SiF_4$), which is also called as reactive ion etching (RIE). On the other hand, the removal with the $O_2$ plasma is a method which is also used as plasma cleaner in the course of a semiconductor production process, and is also called as ashing (ash-making), which is one of means for removal of the organic substance. This method is carried out, in order to clean an organic substance residue remaining on a semiconductor device surface.

Next, the materials used in the method described above are described. Note that the materials described below are those which can be preferably used in all of the mask-integrated surface protective film of the present invention and therefore are not limited to the case of using the mask-integrated surface protective film of the present invention in the above described method.

The semiconductor wafer 1 is a silicon wafer or the like, on its one side, having the patterned face 2 on which the circuit or the like of the semiconductor device is formed. The patterned face 2 is a face on which the circuit or the like of the semiconductor device is formed, which has a street in a planar view.

The mask-integrated surface protective film 3 has a structure wherein the mask material layer 3b is provided on the substrate film 3a, and has a function to protect the semiconductor device formed on the patterned face 2. Specifically, the backing-face of the wafer is ground with support of the semiconductor wafer at the patterned surface 2 thereof in the wafer-thinning step (backgrinding step) which is a post-step. Therefore the mask-integrated surface protective film 3 is required to withstand a load at the grinding occasion. For this reason, the mask-integrated surface protective film 3 is different from a simple resist film or the like, and has: the thickness enough to coat the device formed on the patterned face; and the pressing resistance which is low, and has: a high adhesiveness that can adhere tightly to the device, so that the infiltration of dusts, grinding water, and the like, in grinding, is not occurred.

In particular, the mask-integrated surface protective film 3 of the present invention allows shortening of the time to be required for the removal step of the mask material layer and also cost reduction and efficiency in the production, by thinning the film thickness of the mask material layer 3b to 50 μm or less. For this reason, in the mask-integrated surface protective film 3 of the present invention, the substrate film 3a primarily takes such performances as securement of follow-up property of the mask-integrated surface protective film of the present invention against an asperity of the patterned surface, seepage prevention and dust-intrusion prevention in the wafer-backgrinding step.

The substrate film 3a used in the mask-integrated surface protective film 3 of the present invention is composed of a resin film, and is not particularly limited, as long as it satisfies the above-described performances. The resin may be a resin which shows by itself the above-described performances, or a resin which shows the above-described performance by adding thereto other additives. Further, the substrate film 3a may be a film made by a film formation of a curable resin followed by curing, or may be a film made by a film formation of a thermoplastic resin.

In a case where the substrate film 3a is a film made by a film formation of a thermoplastic resin, examples of the thermoplastic resin include a polystyrene resin, a polyethylene terephthalate resin, and a polypropylene resin. A polystyrene resin is preferable from the viewpoint of an extrudable temperature at the time of producing the substrate film by an extrusion method.

In a case where the substrate film 3a is a film made by a film formation of a curable resin followed by curing, as the curable resin, a photocurable resin, a thermosetting resin, or the like are used, and a photocurable resin is preferably used.

As the photocurable resin, an ultraviolet-curable acrylic resin is preferable. For example, a resin composition composed of a photo-polymerizable urethane acrylate-based oligomer as a base resin is preferably used. The mass-average molecular weight (Mw) of the urethane acrylate-based oligomer is preferably from 1,000 to 50,000, and more preferably from 2,000 to 30,000. The above-described urethane acrylate-based oligomer may be used alone in one kind, or in combination of two or more kinds.

The urethane acrylate-based oligomer is obtained by conducting reaction of an acrylate or methacrylate having a hydroxy group (for example, 2-hydroxyethyl acrylate, 2-hydroxyethyl methacrylate, 2-hydroxypropyl acrylate, 2-hydroxypropyl methacrylate, polyethyleneglycol acrylate, polyethyleneglycol methacrylate, and the like) with a urethane prepolymer having an isocyanate group at the end thereof, which is obtained by conducting reaction of a polyol compound, such as a polyester type- or a polyether type-polyol, and a polyvalent isocyanate compound (for example, 2,4-tolylene diisocyanate, 2,6-tolylene diisocyanate, 1,3-xylylene diisocyanate, 1,4-xylylene diisocyanate, diphenyl methane-4,4'-diisocyanate, and the like).

In a case where it is difficult to carry out a film formation using only a urethane acrylate-based oligomer as described above, ordinarily it is preferable to obtain a substrate film 3a by carrying out the dilution with a photo-polymerizable monomer and the film formation, and thereafter by curing this formed film.

The photo-polymerizable monomer is a monomer having a photo-polymerizable double bond in the molecule. In the present invention, (meth)acrylic acid ester-based compounds having a relatively bulky group, such as isobornyl (meth)acrylate, dicyclopentenyl (meth)acrylate, phenyl hydroxypropyl acrylate, and the like are preferably used.

The photo-polymerizable monomer is blended in the proportion of preferably from 5 to 900 parts by mass, more preferably from 10 to 500 parts by mass, and particularly preferably from 30 to 200 parts by mass, with respect to 100 parts by mass of the urethane acrylate-based oligomer.

In a case where the substrate film 3a is formed using the above-described photocurable resin, a polymerization curing time by light irradiation and a light irradiation amount can be reduced by blending a photo-polymerization initiator to the photocurable resin.

The use amount of the photo-polymerization initiator is preferably from 0.05 to 15 parts by mass, more preferably from 0.1 to 10 parts by mass, and particularly preferably from 0.5 to 5 parts by mass, with respect to the total 100 parts by mass of the photocurable resin. To the photocurable resin, an oligomer and a monomer may be blended in a variety of combination so that the substrate film 3a can achieve the above-described performance. Specifically, the total of the photocurable resin is a total of a urethane acrylate-based oligomer and a photo-polymerizable monomer.

Further, in the above-described resin, additives including: inorganic fillers such as calcium carbonate, silica and mica; metal fillers such as iron and lead; and a colorant such as a pigment and a dye may be contained.

As a thermosetting resin, for example, a blend of a curing agent and a relatively low molecular weight resin such as a polyester resin and a polyether resin is preferably used. A preferable mass-average molecular weight (Mw) thereof is from 10,000 to 100,000. Setting to the above-described range allows adjustment to a more preferable cohesion force. Specifically, if the molecular weight is 100,000 or less, occurrence of the blocking can be effectively prevented by an adequate adhesiveness. Further, if the molecular weight is 10,000 or more, a film which does not get brittle can be prepared by film-making without increasing a blend amount of the cross-linking agent, so that a dust-creating possibility in a clean room can be more lowered.

As the curing agent, a curing agent and its content used in the mask material layer 3b described below are preferably used. In particular, an isocyanate-based curing agent is used.

In the present invention, the substrate film 3a is preferably a single-layered and cured acrylic resin film. Herein, the cured acrylic resin film means a film composed of a cured acrylic resin, preferably a film composed of an ultraviolet-cured acrylic resin. A production method of the cured acrylic resin film is not particularly limited, but it is preferable to render an acrylic resin in the form of a film by curing the acrylic resin.

If the substrate film 3a is composed of an ultraviolet-cured acrylic resin, the adhesion strength between the mask material layer (preferably acrylic mask material layer) and the substrate film 3a can be controlled so as to be lower than the adhesion strength between the mask material layer and an ordinarily used substrate film. Therefore, when the substrate film 3a is peeled, it is easily possible to leave only the mask material layer 3b on the wafer. The acrylic mask material layer means a mask material layer composed of a mask material containing a (meth)acrylic copolymer as described below, or an ethylene-acrylic acid alkyl ester copolymer and the like.

From the viewpoint of shortening a time taken for the ashing step of removing a mask, it is preferable that the thickness of the mask material layer 3b is thin, and it is more preferable that the thickness is 10 μm or less. Note that a practical thickness of the mask material layer 3b is 5 μm or more.

In a case where the substrate film 3a is multilayered, it is preferable that, of this substrate film, a layer placed at the distance farthest from the mask material layer 3b is a high elastic modulus layer and a layer placed at the distance nearest from the mask material layer 3b is a low elastic modulus layer. Also in this case, from the same viewpoint as the above, it is preferable that the thickness of the mask material layer 3b is thin, and it is more preferable that the thickness is 10 μm or less. Note that a practical thickness of the mask material layer 3b is 5 μm or more.

Further, in a case where the substrate film 3a is multilayered, as the mask-integrated surface protective film 3, preferably in the following order, the high elastic modulus layer, the low elastic modulus layer, and the mask material layer 3b are stacked. The mask-integrated surface protective film may have the following other layers between the high elastic modulus layer and the low elastic modulus layer.

For the above-described high elastic modulus layer, a polystyrene resin or a polyethylene terephthalate (PET) resin is preferable.

Further, for the above-described low elastic modulus layer, an ethylene-vinyl acetate copolymer resin or an ethylene-acrylic acid alkyl ester copolymer resin is preferable, and an ethylene-vinyl acetate copolymer (EVA) resin, an ethylene-methyl acrylate copolymer (EMA) resin, or an ethylene-butyl acrylate copolymer (EBA) resin is more preferable.

The ethylene content rate of the ethylene-vinyl acetate copolymer resin or the ethylene-acrylic acid alkyl ester copolymer resin used in the low elastic modulus layer is preferably from 50 to 80% by weight, and more preferably from 60 to 75% by weight.

Note that, in the present invention, the term "copolymer" means any of a random copolymer, an alternative copolymer and a block copolymer.

In a case where the substrate film 3a is multilayered, a layer which may be provided between the high elastic modulus layer and the low elastic modulus layer is not particularly limited, and a layer composed of a plastic, a rubber, or the like may be selected. In the layer, examples of its materials include: a homopolymer or copolymer of α-olefin, such as polyethylene, polypropylene, ethylene/propylene copolymer, polybutene-1, poly-4-methylpentene-1, ethylene/vinyl acetate copolymer, ethylene/acrylic acid copolymer, and ionomers, or a mixture thereof; an elemental substance or a mixture of 2 or more kinds, such as polyethylene terephthalate, polyethylene naphthalate, polyphenylene sulfide, polyether imide, polyimide, polycarbonate, polymethyl methacrylate, polyurethane, and styrene/ethylene/butene- or pentene-based copolymer; and a resin composition in which another resin, a filler, an additive or the like is blended with any of the foregoing polymers. These can be arbitrarily selected depending on the required characteristics. A laminate of a low-density polyethylene and an ethylene/vinyl acetate copolymer, a laminate of a polypropylene and a polyethylene terephthalate, a polyethylene terephthalate, or a polyethylene naphthalate is one of preferable materials.

In a case where a film formation of the substrate film 3a is carried out with a curable resin, the film may be formed by a cast method.

For example, the substrate film 3a may be produced by casting a liquid resin (a pre-curing resin, a resin solution, or the like) on a peeling film in the thin-film form, and then further laminating a peeling film on the resin in the thin-film form, followed by rendering this laminate to a film with a predetermined means, and then removing the peeling films on both sides thereof. According to the forgoing production method, a stress to the resin at the film formation is lessened, and a fisheye formation is lessened. Further, the uniformity of the film thickness is increased and the thickness precision ordinarily gets to 2% or less.

Further, in a case where the film formation of the substrate film 3a is carried out with a thermoplastic resin, the substrate film 3a may be produced by a commonly used extrusion method. In the case where the substrate film 3a is obtained by laminating various resins, these are produced by a co-extrusion method, a lamination method, or the like. At this time, as conventionally practiced in the ordinary production method of the laminate film, an adhesion layer may be provided between resins.

From the viewpoint of a strength-elongation property and a radiation transmittance, the total thickness of the substrate film 3a is preferably from 20 to 280 μm, more preferably from 20 to 225 μm, still more preferably from 20 to 200 μm, still furthermore preferably from 45 to 200 μm, particularly preferably from 75 to 200 μm, and most preferably from 80 to 180 μm.

In a case where the substrate film 3a is multilayered including the high elastic modulus layer and the low elastic modulus layer, the thickness of the high elastic modulus layer is preferably from 20 to 80 nm, and more preferably from 25 to 75 μm, and the thickness of the low elastic modulus layer is preferably from 25 to 200 μm, and more preferably from 50 to 150 μm.

The mask material layer 3b does not damage a semiconductor and the like at the time of adhesion to the patterned surface 2, and does not cause a breakage of the semiconductor and the like and a deposit of the mask material on the surface thereof at the time of its removal, and also the mask material layer is required to have a plasma resistance which acts as a mask at the time of plasma dicing.

For this reason, the mask material layer 3b is not particularly limited, as long as it has the forgoing properties, and a film formed by using a thermoplastic resin as a non-curable mask material may be used. Further, as the curable mask material, it is also possible to use a film obtained by a film formation and curing of a curable resin, and also to use a radiation-polymerizable mask material such as an ultraviolet curable mask material in which a mask material presents a 3-dimentional reticulation due to radiation (preferably ultraviolet ray) curing, and an ionizing radiation like an electronic beam-curable mask material. In the present invention, a non-curable mask material and a curable resin are preferably used.

Note that the radiation is a concept including a light such as an ultraviolet ray, and an ionizing radiation such as an electron beam.

In a case where the mask material layer 3b is a layer formed by a film formation with a thermoplastic resin, as the thermoplastic resin, an ethylene-vinyl acetate copolymer resin or an ethylene-acrylic acid alkyl ester copolymer resin is preferable, and an ethylene-vinyl acetate copolymer (EVA) resin, an ethylene-methyl acrylate copolymer (EMA) resin, or an ethylene-butyl acrylate copolymer (EBA) resin is more preferable.

The ethylene content rate of the ethylene-vinyl acetate copolymer resin or the ethylene-acrylic acid alkyl ester copolymer resin used in the mask material layer 3b is preferably from 50 to 80% by weight, and more preferably from 60 to 75% by weight.

In particular, in a case where the substrate film 3a is a film formed by a film formation with a thermoplastic resin, it is preferable that the mask material layer 3b is a layer formed by a film formation with a thermoplastic resin from the viewpoint of being able to produce the mask-integrated surface protective film at one time by a co-extrusion method or the like, and it is more preferable that the substrate film 3a is composed of a polystyrene resin and the mask material layer 3b is composed of an ethylene-vinyl acetate copolymer (EVA) resin, an ethylene-methyl acrylate copolymer (EMA) resin, or an ethylene-butyl acrylate copolymer (EBA) resin. In this case, lamination (bond) of the mask-integrated surface protective film on the side of the patterned surface of the semiconductor in the above-described step (a) is preferably carried out by a heat lamination within a range of 50° C. to 100° C.

In a case where the mask material layer 3b is a film formed by a film formation with a curable resin, followed by curing, it is preferable that the curable resin contains a (meth)acrylic copolymer and a curing agent.

Examples of the (meth)acrylic copolymer include a copolymer composed of (meth)acrylic acid and/or (meth)acrylic acid ester as a polymer constituent unit, or a copolymer made by using a functional monomer, and a mixture of these polymers. The mass-average molecular weight of these polymers is preferably from about 100,000 to about 500,000.

A proportion of the (meth)acrylic acid ester component of the total monomer component of the (meth)acrylic copolymer is preferably 50% or more, more preferably 70% or more, and further more preferably 80% or more. Further, in a case where the proportion of the (meth)acrylic acid ester component of the total monomer component of the (meth) acrylic copolymer is not 100% by mole, it is preferable that the remaining monomer component is a monomer component (constituent and the like derived from (meth)acrylic acid) existing in the form of (meth)acryloyl group polymerized as a polymerizable group. Further, the proportion of the total (meth)acrylic acid ester component and/or (meth) acrylic acid component, having a functional group (for example, hydroxyl group) reacting with a curing agent of the total monomer component of the (meth)acrylic copolymer is preferably 5% by mole or more, and more preferably 10% by mole or more. The upper limit is preferably 35% by mole or less, more preferably 25% by mole or less.

The above-described (meth)acrylic acid ester component is preferably a (meth)acrylic acid alkyl ester (also referred to as alkyl (meth)acrylate). The number of carbon atoms of the alkyl group which constitutes the (meth)acrylic acid alkyl ester is preferably from 1 to 20, more preferably from 1 to 15, and further more preferably from 1 to 12.

The content (content converted to the state before reacting with a curing agent) of the (meth)acrylic copolymer in the mask material layer 3b is preferably 80% by mass or more, more preferably 90% by mass or more, and still more preferably from 95 to 99.9% by mass.

The curing agent is used for adjusting an adhesion force and a cohesion force, by conducting reaction of it with a functional group of the (meth)acrylic copolymer. Examples of the curing agent include: an epoxy compound (hereinafter, also referred to as "epoxy-series curing agent") having 2 or more epoxy groups in the molecule, such as 1,3-bis(N,N-diglycidyl aminomethyl)cyclohexane, 1,3-bis(N,N-diglycidyl aminomethyl)toluene, 1,3-bis(N,N-diglycidyl aminomethyl)benzene, or N,N,N',N'-tetraglycidyl-m-xylenediamine; an isocyanate compound (hereinafter, also referred to as "isocyanate-series curing agent") having 2 or more isocyanate groups in the molecule, such as 2,4-tolylenediisocyanate, 2,6-tolylenediisocyanate, 1,3-xylylenediisocyanate, 1,4-xylylenediisocyanate, or diphenylmethane-4,4'-diisocyanate; an aziridine-based compound having 2 or more aziridinyl groups in the molecule, such as tetramethylol-tri-β-aziridinyl propionate, trimethylol-tri-β-aziridinyl propionate, trimethylolpropane-tri-β-aziridinyl propionate, or trimethylolpropane-tri-β-(2-methylaziridine) propionate; and the like. An addition amount of the curing agent may be adjusted depending on a desired adhesion force, and is suitably from 0.1 to 5.0 mass parts with respect to 100 mass parts of the (meth)acrylic copolymer. In the mask material layer of the mask-integrated surface protective film of the present invention, the curing agent is in a state of having reacted with the (meth)acrylic copolymer.

The thickness of the mask material layer 3b is 50 μm or less. This allows shortening of the processing time for ashing by $O_2$ plasma. From the viewpoints of further increasing a protective ability for the device or the like formed on the patterned face 2 and further increasing an adhesion property to the patterned face, the thickness of the mask material layer 3b is preferably from 5 to 30 μm and more preferably from 5 to 10 μm. In this regard, depending on the variety of the device, an asperity of the patterned surface is approximately about a few micrometers to about 10 μm, and therefore the thickness of the mask material layer 3b is preferably from 5 to 10 μm.

It is preferable to perform none of a corona treatment which is an adhesion-improving treatment, an easy adhesion primer coating or the like between the layers of the substrate film 3a and the mask material layer 3b, in order that only the substrate film 3a can be easily teared off.

Further, from the similar purport, it is preferable to laminate a mask material layer 3b on a smooth surface of the substrate film 3a, whereas it is preferable not to laminate the mask material layer 3b on a concave-convex surface (embossed surface) of the substrate film 3a. This is because if the mask material layer 3b is laminated on the concave-convex surface, an adhesion property of the mask material layer 3b to the substrate film 3a is increased. Further, as the substrate film 3a, it is also preferable to use a separator which makes it easy to peel from the mask material layer 3b.

The wafer-fixing tape 4 is required to hold the semiconductor wafer 1 and to have resistance to plasma which is sustainable even if the wafer-fixing tape is subjected to the plasma dicing step. Further, in the picking-up step, a good picking-up property and also an expansion property and the like in some cases are required. Further, use may be made of any of dicing tapes used in a conventional plasma dicing method, which are generally called as a dicing tape. Further, the use can be also made of a dicing die-bonding tape, in which an adhesion bond for die-bonding is laminated between the temporary-adhesive layer and the substrate film, in order to make it easy to transit to the dicing die-bonding step after picking-up.

For the laser irradiation with which the mask material layer 3b is cut, use can be made of a laser irradiator for irradiating an ultraviolet or infrared laser light. In this laser irradiator, a laser irradiation part capable of freely moving along the street of the semiconductor wafer 1 is arranged. Laser can be irradiated, which is provided with an output controlled suitably to remove the mask material layer 3b. In particular, if $CO_2$ laser is used as a laser light, it is possible to obtain a large power of several to tens of watts. $CO_2$ laser can be preferably used for the present invention.

In order to carry out the plasma dicing and the plasma ashing, use can be made of a plasma-etching apparatus. The plasma-etching apparatus is an apparatus, which is capable of subjecting the semiconductor wafer 1 to dry etching, and in which a sealed treatment space is made in a vacuum chamber, to place the semiconductor wafer 1 on the side of the electrode for a high-frequency wave. A gas for plasma generation is supplied from the side of a gas-supplying electrode provided facing the electrode for high-frequency wave. If a high-frequency voltage is applied to the electrode for a high-frequency wave, plasma is generated between the gas-supplying electrode and the electrode for a high-frequency wave. Therefore, the resultant plasma is used. By circulating a refrigerant in a heat-producing electrode for high-frequency wave, it is possible to prevent a temperature elevation of the semiconductor wafer 1 due to the heat of this plasma.

In accordance with the method of producing the semiconductor chip (the method of processing the semiconductor wafer), any photolithographic step or the like becomes unnecessary, which is provided with a resist to be used in the conventional plasma dicing process, by giving a mask function in the plasma dicing to the surface protective tape (substrate film) protecting the patterned face. In particular, by using the surface protective tape, a technique becomes unnecessary, in which a high level of alignment, such as printing and transferring, is required for the mask formation. Therefore the mask-integrated surface protective film of the present invention can be easily laminated on the semiconductor wafer surface, and a mask can be easily formed by the laser equipment.

Further, the mask material layer 3b can be removed with $O_2$ plasma, and therefore removal of the mask portion can be carried out by the same apparatus as the plasma dicing apparatus. In addition, the plasma dicing is carried out from the patterned face 2 side (surface S side), and therefore it is not necessary to turn the chip upside down before the picking-up operation. From these reasons, the facilities can be simplified, and process costs can be considerably suppressed.

Second Embodiment [FIG. 6]

In the first embodiment, after peeling the substrate film 3a of the mask-integrated surface protective film 3, the mask material layer 3b was cut off by $CO_2$ laser to form an opening on the street portion. In contrast, the second embodiment is different from the first embodiment in the point that while remaining the substrate film 3a in the mask-integrated surface protective film, both the substrate film 3a and the mask material layer 3b are cut off by the $CO_2$ laser to form an opening on the street portion.

Figure 2C:
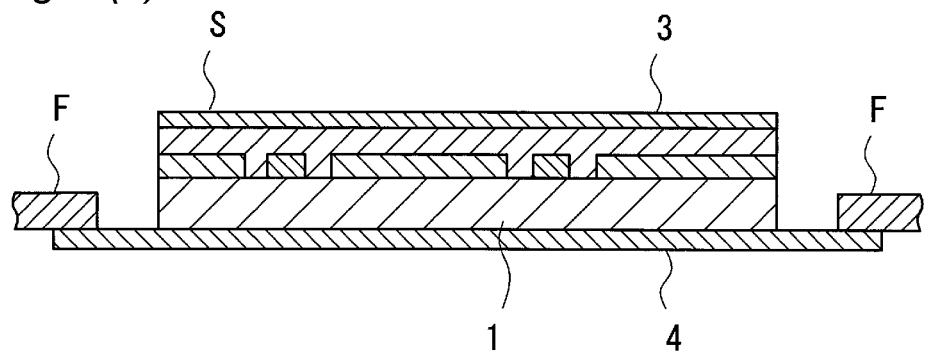
Figure 6A:
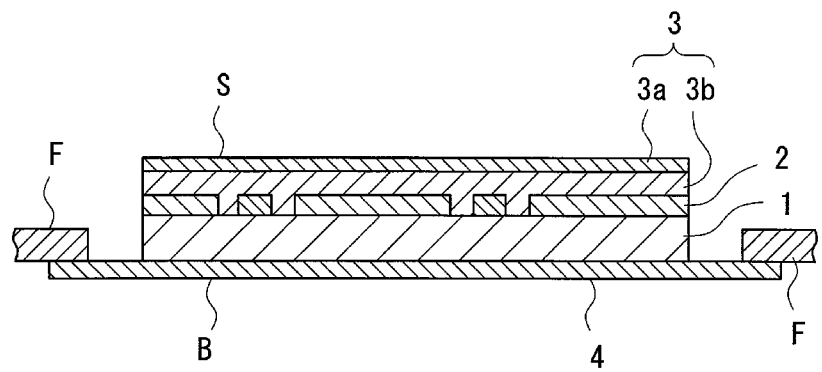
FIGS. 6(a) to 6(c) are schematic cross-sectional views illustrating states before and after conducting a street opening with a laser in the second embodiment using the mask-integrated surface protective film of the present invention. In the views, fragmentary
Figure 6B:
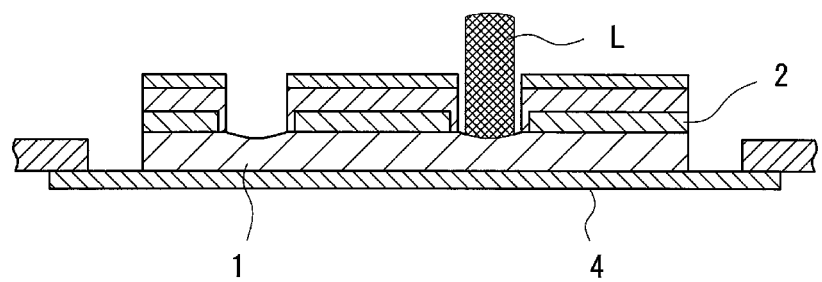
Figure 6C:
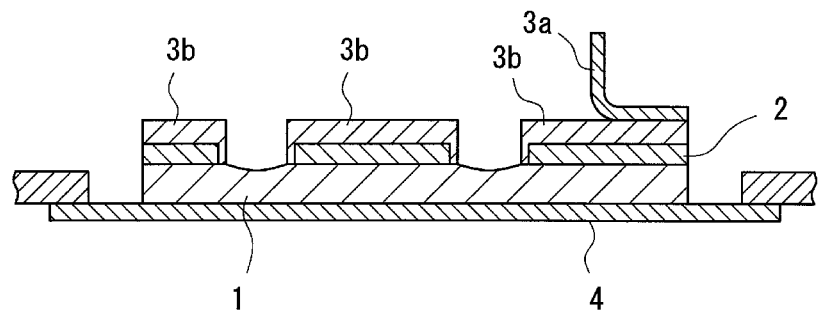

Specifically, after laminating the mask-integrated surface protective film 3 on the surface S side of the semiconductor wafer 1, and laminating the wafer fixing tape 4 on the ground backing-face B side of the semiconductor wafer 1, and supporting and fixing it to the ring flame F (see FIG. 2(c), FIG. 6(a)), the mask-integrated surface protective film 3 is removed by irradiating a $CO_2$ laser L onto a plurality of streets (not shown) appropriately formed in a reticular pattern or the like from the surface S side to form an opening on the street portion (see FIG. 6(b)). Next, the substrate film 3a on the remaining mask portion is removed to expose the mask material layer 3b (see FIG. 6(c)). Then, this step is transited to a plasma dicing step.

Regarding the removal of the remaining substrate film 3a on the mask portion, if a method in which a separately prepared adhesive tape is adhered to the substrate film 3a to be removed and then the substrate film 3a is removed together with the adhesive tape is adopted, the substrate film 3a can be preferably removed with ease.

Each of the above-described embodiments is an example of the present invention and therefore the present invention is not limited to these embodiments. Accordingly, addition, deletion, modification and the like of a known process may be made in each process to the extent of no departure from the scope of the present invention.

EXAMPLES

The present invention will be described in more detail based on examples given below, but the invention is not meant to be limited by these.

[Example 1] Preparation of Mask-Integrated Surface Protective Film, and Production of Semiconductor Chip <Preparation of Mask-Integrated Surface Protective Film>

A mask-integrated surface protective film 3 composed of a polystyrene resin (trade name: XC-515, manufactured by DIC Corporation) and an ethylene-butyl acrylate copolymer (EBA) resin (trade name: LOTRYL 30BA02, manufactured by ARKEMA K.K., ethylene content rate: 70% by weight) was prepared in the form of a film in accordance with an extrusion method so that the film thicknesses of the layers were polystyrene resin: EBA resin=90 μm: 10 μm, and the total film thickness was 100 μm. Hereinafter, the polystyrene resin layer was used as the substrate film 3a, and the EBA resin layer was used as the mask material layer 3b.

<Production of Semiconductor Chip>

The obtained mask-integrated surface protective film was laminated on the surface of a silicon wafer (diameter: 8 inches) having thereon scribe lines using a laminator DR8500III (trade name, manufactured by Nitto Seiki Co., Ltd.). The lamination temperature was set to 80° C., the lamination rate was set to 7 mm/sec, and the lamination pressure was set to 0.35 MPa.

After that, the surface (wafer backing-face) opposite to the surface on which the above-described mask-integrated surface protective film 3 was laminated, was ground using DGP8760 (trade name, manufactured by DISCO Corporation) until a thickness of the wafer got to 50 μm. A dicing tape was laminated on the backing-face side of the ground wafer using RAD-2700F (trade name, manufactured by Lintec Corporation) to perform a wafer mount. Thereafter, by adhering an adhesive tape to the polystyrene layer, and then peeling only the substrate film 3a (polystyrene layer), only the mask material layer 3b (EBA layer) was left on the wafer.

Next, the mask material on the scribe line was removed by a $CO_2$ laser to form an opening on the scribe line.

Thereafter, by using a $SF_6$ gas as a plasma-generating gas and adjusting conditions so that a silicon wafer could be diced at the etching rate of 15 μm/min, a plasma irradiation was conducted from the mask material layer side. In accordance with the plasma dicing, the wafer was cut, followed by dividing into individual chips. Next, by using an $O_2$ gas as a plasma-generating gas and adjusting conditions so that the mask material could be removed at the etching rate of 1.5 μm/min, the mask material was removed by ashing for 10 minutes. After that, an ultraviolet ray was irradiated (irradiation dose: 200 mJ/cm$^2$) from the dicing tape side thereby to decrease an adhesive force of the dicing tape, and chips were picked up.

[Example 2] Preparation of Mask-Integrated Surface Protective Film, and Production of Semiconductor Chip <Preparation of Mask-Integrated Surface Protective Film>

A mask-integrated surface protective film 3 composed of a polystyrene resin (trade name: XC-515, manufactured by DIC Corporation) and an ethylene-vinyl acetate copolymer (EVA) resin (trade name: ULTRATHENE 635, manufactured by Tosoh Corporation, ethylene content rate: 75% by weight) was prepared in the form of a film in accordance with an extrusion method so that the film thicknesses of the layers were polystyrene resin: EVA resin=95 μm: 5 μm, and the total film thickness was 100 μm. Hereinafter, the polystyrene resin layer was used as the substrate film 3a, and the EVA resin layer was used as the mask material layer 3b.

<Production of Semiconductor Chip>

The obtained mask-integrated surface protective film 3 was laminated on the surface of a silicon wafer (diameter: 8 inches) having thereon scribe lines using a laminator DR8500III (trade name, manufactured by Nitto Seiki Co., Ltd.). The lamination temperature was set to 80° C., the lamination rate was set to 7 mm/sec, and the lamination pressure was set to 0.35 MPa.

After that, the surface (wafer backing-face) opposite to the surface on which the above-described mask-integrated surface protective film was laminated, was ground using DGP8760 (trade name, manufactured by DISCO Corporation) until a thickness of the wafer got to 50 μm. A dicing tape was laminated on the backing-face side of the ground wafer using RAD-2700F (trade name, manufactured by Lintec Corporation) to perform a wafer mount. Thereafter, by adhering an adhesive tape to the polystyrene resin layer, and then peeling only the substrate film 3a (polystyrene resin layer), only the mask material layer 3b (EVA layer) was left on the wafer.

Thereafter, under the same conditions and the same manner as in Example 1, the scribe line opening, the plasma dicing and the ashing were conducted, whereby pickup of chips was carried out.

[Example 3] Preparation of Mask-Integrated Surface Protective Film, and Production of Semiconductor Chip <Preparation of Mask-Integrated Surface Protective Film>

A mask-integrated surface protective film 3 composed of a polystyrene resin (trade name: XC-515, manufactured by DIC Corporation) and an ethylene-vinyl acetate copolymer (EVA) resin (trade name: ULTRATHENE 750, manufactured by Tosoh Corporation, ethylene content rate: 68% by weight) was prepared in the form of a film in accordance with an extrusion method so that the film thicknesses of the layers were polystyrene resin: EVA resin=80 μm: 20 μm, and the total film thickness was 100 μm. Hereinafter, the polystyrene resin layer was used as the substrate film 3a, and the EVA resin layer was used as the mask material layer 3b.

<Production of Semiconductor Chip>

The obtained mask-integrated surface protective film 3 was laminated on the surface of a silicon wafer (diameter: 8 inches) having thereon scribe lines using a laminator DR8500III (trade name, manufactured by Nitto Seiki Co., Ltd.). The lamination temperature was set to 80° C., the lamination rate was set to 7 mm/sec, and the lamination pressure was set to 0.35 MPa.

After that, the surface (wafer backing-face) opposite to the surface on which the above-described mask-integrated surface protective film was laminated, was ground using DGP8760 (trade name, manufactured by DISCO Corporation) until a thickness of the wafer got to 50 μm. A dicing tape was laminated on the backing-face side of the ground wafer using RAD-2700F (trade name, manufactured by Lintec Corporation) to perform a wafer mount. Thereafter, by adhering an adhesive tape to the polystyrene resin layer, and then peeling only the substrate film 3a (polystyrene resin layer), only the mask material layer 3b (EVA layer) was left on the wafer.

Thereafter, in the same manner as in Example 1, except that the $O_2$ plasma irradiation time was changed from 10 minutes to 20 minutes, the scribe line opening, the plasma dicing and the ashing were conducted, whereby pickup of chips was carried out.

[Example 4] Preparation of Mask-Integrated Surface Protective Film, and Production of Semiconductor Chip <Preparation of Mask-Integrated Surface Protective Film>

To 100 parts by mass of a polyester resin composition (mass-average molecular weight: 15,000, glass transition temperature (Tg): 40° C.), 10 parts by mass of CORONATE L (manufactured by Nippon Polyurethane Industry Co., Ltd., isocyanate-based curing agent) as a curing agent was blended to obtain a thermosetting composition A.

The above-described thermosetting composition A was coated and dried on a peeling film. On the dried thermosetting composition A, another peeling film was further laminated and the resultant laminate was subjected to setting for a week to complete the setting, and then by peeling the peeling films on both sides, a cast film a (substrate film 3a) in the form of a film was obtained. The thickness of the cast film a after drying was 100 μm.

An acrylic copolymer (mass-average molecular weight: 400,000, hydroxyl value: 0 mg KOH/g, acid value: 48.8 mg KOH/g, Tg: −23° C.) was synthesized by mixing 20 mol % of acrylic acid, 70 mol % of butyl acrylate and 10 mol % of methyl acrylate and subjecting the mixture solution to polymerization.

To this acrylic copolymer solution, 2.0 parts by mass of TETRAD-X (manufactured by Mitsubishi Gas Chemical Company, Inc., epoxy-based curing agent) was blended with respect to 100 parts by mass of the copolymer to obtain a temporary-adhesive composition B (mask material).

The mask material layer 3b formed by coating the obtained temporary-adhesive composition B on a peeling liner was laminated on a film of the above-described cast film a (substrate film 3a, thickness 100 µm) to obtain the mask-integrated surface protective film 3 having a thickness of 110 µm.

<Production of Semiconductor Chip>

The obtained mask-integrated surface protective film 3 was laminated on the surface of a silicon wafer (diameter: 8 inches) having thereon scribe lines using a laminator DR8500III (trade name, manufactured by Nitto Seiki Co., Ltd.). The lamination temperature was set to 24° C., the lamination rate was set to 7 mm/sec, and the lamination pressure was set to 0.35 MPa.

After that, the surface (wafer backing-face) opposite to the surface on which the above-described mask-integrated surface protective film was laminated, was ground using DGP8760 (trade name, manufactured by DISCO Corporation) until a thickness of the wafer got to 50 µm. A dicing tape was laminated on the backing-face side of the ground wafer using RAD-2700F (trade name, manufactured by Lintec Corporation) to perform a wafer mount. Thereafter, by adhering an adhesive tape to the cast film a, and then peeling only the substrate film 3a (cast film a), only the mask material layer 3b was left on the wafer.

Next, the mask material on the scribe line was removed by a $CO_2$ laser to form an opening on the scribe line.

Thereafter, by using a $SF_6$ gas as a plasma-generating gas and adjusting conditions so that a silicon wafer could be diced at the etching rate of 15 µm/min, a plasma irradiation was conducted from the mask material layer side. In accordance with the plasma dicing, the wafer was cut, followed by dividing into individual chips. Next, by using an $O_2$ gas as a plasma-generating gas and adjusting conditions so that the mask material could be removed at the etching rate of 1.5 µm/min, the mask material was removed by ashing for 10 minutes. After that, an ultraviolet ray was irradiated (irradiation dose: 200 mJ/cm$^2$) from the dicing tape side thereby to decrease an adhesive force of the dicing tape, and chips were picked up.

[Example 5] Preparation of Mask-Integrated Surface Protective Film, and Production of Semiconductor Chip <Preparation of Mask-Integrated Surface Protective Film>

With respect to 100 parts by mass of a urethane acrylate-based oligomer (trade name: CN973, manufactured by ARKEMA K.K.), 60 parts by mass of isobornyl acrylate, 40 parts by mass of phenyl hydroxypropyl acrylate, and 4.0 parts by mass of a photo-polymerization initiator (trade name: IRGACURE 184, manufactured by Ciba-Geigy) were blended to obtain a photocurable resin composition.

The obtained photocurable resin composition was coated on a 50 µm-thick PET film (trade name: LUMIRROR, manufactured by Toray Industries, Inc.) so as to be a thickness of 100 µm to form a photocurable resin composition layer. Thereafter, further the same kind of PET film was laminated on the photocurable resin composition layer. Then, by irradiating thereto an ultraviolet ray using a high-pressure mercury lamp under the condition of light quantity: 300 mJ/cm$^2$, the laminate was prepared in the form of a film.

Then, by peeling PET films on both sides, a 100 µm-thick cast film b (substrate film 3a) was obtained.

An acrylic copolymer (mass-average molecular weight: 400,000, hydroxyl value: 0 mg KOH/g, acid value: 48.8 mg KOH/g, Tg: −23° C.) was synthesized by mixing 20 mol % of acrylic acid, 70 mol % of butyl acrylate and 10 mol % of methyl acrylate and subjecting the mixture solution to polymerization.

To this acrylic copolymer solution, 2.0 parts by mass of TETRAD-X (manufactured by Mitsubishi Gas Chemical Company, Inc., epoxy-based curing agent) as a curing agent was blended with respect to 100 parts by mass of the copolymer to obtain a temporary-adhesive composition B (mask material).

The mask material layer 3b formed by coating the obtained temporary-adhesive composition B on a peeling liner was laminated on a film of the above-described cast film b (substrate film 3a, thickness 100 µm) to obtain the mask-integrated surface protective film 3 having a thickness of 110 µm.

<Production of Semiconductor Chip>

The obtained mask-integrated surface protective film 3 was laminated on the surface of a silicon wafer (diameter: 8 inches) having thereon scribe lines using a laminator DR8500III (trade name, manufactured by Nitto Seiki Co., Ltd.). The lamination temperature was set to 24° C., the lamination rate was set to 7 mm/sec, and the lamination pressure was set to 0.35 MPa.

After that, the surface (wafer backing-face) opposite to the surface on which the above-described mask-integrated surface protective film was laminated, was ground using DGP8760 (trade name, manufactured by DISCO Corporation) until a thickness of the wafer got to 50 µm. A dicing tape was laminated on the backing-face side of the ground wafer using RAD-2700F (trade name, manufactured by Lintec Corporation) to perform a wafer mount. Thereafter, by adhering an adhesive tape to the cast film a, and then peeling only the substrate film 3a (cast film b), only the mask material layer 3b was left on the wafer.

Thereafter, under the same conditions and the same manner as in Example 4, the scribe line opening, the plasma dicing and the ashing were conducted, whereby pickup of chips was carried out.

[Example 6] Preparation of Mask-Integrated Surface Protective Film, and Production of Semiconductor Chip On a 50 µm-thick polyethylene terephthalate (PET) film (trade name: G2C, manufactured by Teijin DuPont films. Ltd.), an ethylene-butyl acrylate copolymer (EBA) resin (trade name: LOTRYL 30BA02, manufactured by ARKEMA K.K., ethylene content rate: 70% by weight) was stacked in accordance with an extrusion method so as to be a thickness of 145 µm to obtain the substrate film 3a having the total thickness of 195 µm. The PET film is a high-elastic modulus layer and the EBA resin layer is a low-elastic modulus layer.

An acrylic copolymer (mass-average molecular weight: 400,000, hydroxyl value: 0 mg KOH/g, acid value: 48.8 mg KOH/g, Tg: −23° C.) was synthesized by mixing 20 mol % of acrylic acid, 70 mol % of butyl acrylate and 10 mol % of methyl acrylate and subjecting the mixture solution to polymerization.

To this acrylic copolymer solution, 2.0 parts by mass of TETRAD-X (manufactured by Mitsubishi Gas Chemical Company, Inc., epoxy-based curing agent) as a curing agent was blended with respect to 100 parts by mass of the copolymer to obtain a temporary-adhesive composition B (mask material).

The mask material layer 3b formed by coating the obtained temporary-adhesive composition B on a peeling liner so that a thickness after drying got to 5 μm was laminated on the EBA resin layer side of the above-described substrate film 3a to obtain the mask-integrated surface protective film 3 having a thickness of 200 μm.

<Production of Semiconductor Chip>

The obtained mask-integrated surface protective film 3 was laminated on the surface of a silicon wafer (diameter: 8 inches) having thereon scribe lines using a laminator DR8500III (trade name, manufactured by Nitto Seiki Co., Ltd.). The lamination temperature was set to 24° C., the lamination rate was set to 7 mm/sec, and the lamination pressure was set to 0.35 MPa.

After that, the surface (wafer backing-face) opposite to the surface on which the above-described mask-integrated surface protective film was laminated, was ground using DGP8760 (trade name, manufactured by DISCO Corporation) until a thickness of the wafer got to 50 μm. A dicing tape was laminated on the backing-face side of the ground wafer using RAD-2700F (trade name, manufactured by Lintec Corporation) to perform a wafer mount. Thereafter, by adhering an adhesive tape on the PET film of the substrate film, and then peeling only the substrate film 3a (PET+EBA), only the mask material layer 3b was left on the wafer.

Next, the mask material on the scribe line was removed by a $CO_2$ laser to form an opening on the scribe line.

Thereafter, by using a $SF_6$ gas as a plasma-generating gas and adjusting conditions so that a silicon wafer could be diced at the etching rate of 15 μm/min, a plasma irradiation was conducted from the mask material layer side. In accordance with the plasma dicing, the wafer was cut, followed by dividing into individual chips. Next, by using an $O_2$ gas as a plasma-generating gas and adjusting conditions so that the mask material could be removed at the etching rate of 1.5 μm/min, the mask material was removed by ashing for 10 minutes. After that, an ultraviolet ray was irradiated (irradiation dose: 200 mJ/cm$^2$) from the dicing tape side thereby to decrease an adhesive force of the dicing tape, and chips were picked up.

[Comparative Example 1] Preparation of Mask-Integrated Surface Protective Film Having 80 μm-Thick Mask Material Layer, and Production of Semiconductor Chip <Preparation of Mask-Integrated Surface Protective Film>

A mask-integrated surface protective film in which a polyethylene resin layer (substrate film) and an EBA resin layer (mask material layer) were stacked was obtained in the same manner as in Example 1, except that the film thicknesses of the layers in Example 1 were changed to polystyrene resin: EBA resin=80 μm: 80 μm, and the total film thickness was changed to 160 μm.

<Production of Semiconductor Chip>

The obtained mask-integrated surface protective film 3 was laminated on the surface of a silicon wafer (diameter: 8 inches) having thereon scribe lines using a laminator DR8500III (trade name, manufactured by Nitto Seiki Co., Ltd.). The lamination temperature was set to 80° C., the lamination rate was set to 7 mm/sec, and the lamination pressure was set to 0.35 MPa.

After that, the surface (wafer backing-face) opposite to the surface on which the above-described mask-integrated surface protective film was laminated, was ground using DGP8760 (trade name, manufactured by DISCO Corporation) until a thickness of the wafer got to 50 μm. A dicing tape was laminated on the backing-face side of the ground wafer using RAD-2700F (trade name, manufactured by Lintec Corporation) to perform a wafer mount. Thereafter, by adhering an adhesive tape to the polystyrene resin layer, and then peeling only the substrate film (polystyrene resin layer), only the mask material layer (EBA layer) was left on the wafer.

Next, the mask material on the scribe line was removed by a $CO_2$ laser to form an opening on the scribe line.

Thereafter, by using a $SF_6$ gas as a plasma-generating gas and adjusting conditions so that a silicon wafer could be diced at the etching rate of 15 μm/min, a plasma irradiation was conducted from the mask material layer side. In accordance with the plasma dicing, the wafer was cut, followed by dividing into individual chips. Next, ashing was conducted for 30 min under the same conditions as in Example 1 to remove the mask material. After that, an ultraviolet ray was irradiated (irradiation dose: 200 mJ/cm$^2$) from the dicing tape side thereby to decrease an adhesive force of the dicing tape, and chips were picked up.

[Comparative Example 2] Preparation of Mask-Integrated Surface Protective Film Having 70 μm-Thick Mask Material Layer, and Production of Semiconductor Chip <Preparation of Mask-Integrated Surface Protective Film>

A mask-integrated surface protective film in which a mask material layer (thickness 70 μm) composed of the cast film a (substrate film, thickness 100 μm) and temporary-adhesive composition B were stacked was obtained in the same manner as in Example 4, except that the thickness of the mask material layer in Example 4 was changed from 10 μm to 70 μm.

<Production of Semiconductor Chip>

The obtained mask-integrated surface protective film was laminated on the surface of a silicon wafer (diameter: 8 inches) having thereon scribe lines using a laminator DR8500III (trade name, manufactured by Nitto Seiki Co., Ltd.). The lamination temperature was set to 24° C., the lamination rate was set to 7 mm/sec, and the lamination pressure was set to 0.35 MPa.

After that, the surface (wafer backing-face) opposite to the surface on which the above-described mask-integrated surface protective film was laminated, was ground using DGP8760 (trade name, manufactured by DISCO Corporation) until a thickness of the wafer got to 50 μm. A dicing tape was laminated on the backing-face side of the ground wafer using RAD-2700F (trade name, manufactured by Lintec Corporation) to perform a wafer mount. Thereafter, by adhering an adhesive tape to the cast film a, and then peeling only the substrate film 3a (cast film a), only the mask material layer 3b was left on the wafer.

Next, the mask material on the scribe line was removed by a $CO_2$ laser to form an opening on the scribe line.

Thereafter, by using a $SF_6$ gas as a plasma-generating gas and adjusting conditions so that a silicon wafer could be diced at the etching rate of 15 μm/min, a plasma irradiation was conducted from the mask material layer side. In accordance with the plasma dicing, the wafer was cut, followed by dividing into individual chips. Next, ashing was conducted for 30 min under the same conditions as in Example 4 to remove the mask material. After that, an ultraviolet ray was irradiated (irradiation dose: 200 $mJ/cm^2$) from the dicing tape side thereby to decrease an adhesive force of the dicing tape, and chips were picked up.

[Comparative Example 3] Mask Formation by Photolithography Process, Preparation of Surface Protective Tape, and Production of Semiconductor Chip <Preparation of Wafer with Mask Material>

A silicon wafer having a chip size of 10 mm×10 mm and having thereon 8 inches scribe line with a scribe line width of 70 μm was prepared using a laser. On the prepared wafer, a positive-working light-sensitive material was coated to form a 10 μm-thick resist mask material. An ultraviolet irradiation was conducted only on the scribe line using a photomask and then the resist mask material on the scribe line was removed with an alkaline developer to prepare a wafer with a mask material.

<Preparation of Ultraviolet-Curable Surface Protective Tape>

20 mol % of methacrylic acid, 30 mol % of 2-ethylhexyl acrylate, 10 mol % of 2-hydroxyethyl acrylate, and 40 mol % of methyl acrylate were mixed, and the mixture was subjected to a solution polymerization to obtain a solution of a polymer having a mass-average molecular weight of 600,000.

To the forgoing polymer solution, 100 parts by mass of a 6-functional urethane acrylate oligomer (manufactured by Shin-Nakamura Chemical Co., Ltd.) and 50 parts by mass of a 3-functional urethane acrylate oligomer (manufactured by Shin-Nakamura Chemical Co., Ltd.) as an ultraviolet-reactive resin, 4.0 parts by mass of CORONATE L (manufactured by Nippon Polyurethane Industry Co., Ltd., isocyanate-based curing agent) as a curing agent, and 10 parts by mass of IRGACURE 184 (manufactured by BASF) as a photo-polymerization initiator were blended with respect to 100 parts by mass of the polymer to obtain a temporary-adhesive composition.

The obtained temporary-adhesive composition was coated on a transparent peeling liner so that a thickness of the temporary-adhesive layer was 30 μm. The formed temporary-adhesive layer was laminated on a corona-treated surface of the 100 μm-thick LDPE (low density polyethylene) film to obtain a 130 μm-thick ultraviolet-curable surface protective tape.

<Production of Semiconductor Chip>

The above-described ultraviolet-curable surface protective tape was laminated on the above-prepared wafer with a mask material using a laminator DR8500III (trade name, manufactured by Nitto Seiki Co., Ltd.).

After that, the surface (wafer backing-face) opposite to the surface on which the above-described ultraviolet-curable surface protective tape was laminated, was ground using DGP8760 (trade name, manufactured by DISCO Corporation) until a thickness of the wafer got to 50 μm. A dicing tape was laminated on the backing-face side of the ground wafer using RAD-2700F (trade name, manufactured by Lintec Corporation) to perform a wafer mount. Further, after irradiating an ultraviolet ray of 500 $mJ/cm^2$ from the ultraviolet-curable surface protective tape surface side using a high-pressure mercury lamp, peeling of the ultraviolet-curable surface protective tape was carried out.

After that, a plasma etching was carried out under the same conditions as in Example 4, whereby chipping of the wafer and removal of the mask material were carried out. Further, pickup of the chips was carried out under the same conditions as in Example 4.

[Test Example 1] Peeling Property Evaluation of Substrate Film (Surface Protective Tape)

In the <Production of semiconductor chip> in each of the above-described Examples and Comparative Examples, a peeling property of the substrate film (surface protective tape) from a wafer using RAD-2700F (trade name, manufacturing Lintec Corporation) was evaluated in accordance with the following criteria.

—Evaluation Criteria of the Peeling Property of the Substrate Film (Surface Protective Tape)—

○: Only the substrate film (surface protective tape) was able to be peeled, so that only the mask material layer was able to be left on the wafer.

x: The substrate film was not able to be peeled, or the substrate film was peeled together with the mask material layer.

[Test Example 2] Removal Property Evaluation of the Mask Material Layer by Plasma In each of the above-described Examples and Comparative Examples, the presence or absence of a residual mask material layer at the time of ashing with $O_2$ plasma was confirmed by a laser microscope.

—Removal Property Evaluation of the Mask Material Layer—

○: A residue of the mask material layer was non-existent.

x: A residue of the mask material layer was existent.

[Test Example 3] Evaluation of Adhesive Deposit on the Scribe Line

In the <Production of semiconductor chip> in each of the above-described Examples and Comparative Examples, a wafer surface after peeling of the substrate film (surface protective tape) was observed by a microscope to determine the presence or absence of an adhesive deposit on the scribe line.

—Evaluation Criteria of Adhesive Deposit on the Scribe Line—

○: An adhesive deposit was non-existent.

x: An adhesive deposit was existent.

The results of the Test Examples 1 to 3 are shown in the following table.

Note that the mark "-" indicates that the evaluation was undecidable.

TABLE 1

|  | Ex 1 | Ex 2 | Ex 3 | Ex 4 | Ex 5 | Ex 6 | CEx 1 | CEx 2 | CEx 3 |
|---|---|---|---|---|---|---|---|---|---|
| Peeling property of substrate film (surface protective tape) | ○ | ○ | ○ | ○ | ○ | ○ | ○ | ○ | x |
| Removal property of mask material layer | ○ | ○ | ○ | ○ | ○ | ○ | x | x | — |
| Adhesive deposit on scribe line | ○ | ○ | ○ | ○ | ○ | ○ | ○ | ○ | — |

Remarks:
'Ex' means Example according to this invention, and
'CEx' means Comparative Example.

As shown in the above Table 1, in Examples 1 to 5, the substrate film (surface protective tape) was peelable, so that only the mask material layer could be left on the wafer. In a subsequent etching with SF$_6$, evidence about the mask material layer having been ground was little or nothing, and by the etching with O$_2$ in the next step, the mask material layer could be entirely removed. Further, the adhesive deposit was also non-existent on the scribe face, and therefore occurrence of a burr or the like on the chip was nothing, so that chipping could be performed finely.

On the other hand, in Comparative Examples 1 and 2, only the mask material layer could be left on the wafer. However, even when O$_2$ plasma was irradiated at the threefold or more irradiance level compared to an ordinary condition, the mask material layer resulted in a residue on the wafer. Any further level of O$_2$ plasma irradiation affects a dicing tape, so that there is a high possibility of affecting a pickup property.

In Comparative Example 3, as a result of a reaction between a resist agent and an ultraviolet curable temporary-adhesive due to the ultraviolet ray, when the surface protective tape was peeled, a mask material layer was also peeled together therewith. For this reason, it was impossible to conduct the evaluation itself at the subsequent plasma etching step.

Having described our invention as related to the present embodiments, it is our intention that the invention not be limited by any of the details of the description, unless otherwise specified, but rather be construed broadly within its spirit and scope as set out in the accompanying claims.

REFERENCE SIGNS LIST

1 Semiconductor wafer
2 Patterned face
3 Mask-integrated surface protective film
　3a Substrate film
　3b Mask material layer
4 Wafer fixing tape
7 Chip
S Surface
B Backing-face
M1 Wafer-grinding apparatus
M2 Pin
M3 Collet
F Ring flame
L CO$_2$ laser
P1 Plasma of SF$_6$ gas
P2 Plasma of O$_2$ gas

The invention claimed is:

1. A mask-integrated surface protective film, comprising:
a substrate film, and
a mask material layer provided on the substrate film,
wherein the mask material layer is an ethylene-vinyl acetate copolymer resin or an ethylene-butyl acrylate copolymer resin,
wherein the substrate film comprises a polystyrene resin, wherein
the substrate film is multilayered,
of the substrate film, a layer placed at the distance farthest from the mask material layer is a high elastic modulus layer and a layer placed at the distance nearest from the mask material layer is a low elastic modulus layer,
the thickness of the mask material layer is 10 µm or less,
the low elastic modulus layer is an ethylene-vinyl acetate copolymer resin or an ethylene-butyl acrylate copolymer resin, and
the ethylene content rate of the ethylene-vinyl acetate copolymer resin or ethylene-butyl acrylate copolymer resin is from 50 to 80% by weight.

2. The mask-integrated surface protective film according to claim 1, which is used for a plasma dicing.

3. A method of making a semiconductor chip which comprises, the following steps (a) to (d), wherein
the mask-integrated surface protective film has a substrate film and a mask material layer provided on the substrate film,
the substrate film is multilayered,
of the substrate film, a layer placed at the distance farthest from the mask material layer is a high elastic modulus layer and a layer placed at the distance nearest from the mask material layer is a low elastic modulus layer,
the thickness of the mask material layer is 10 µm or less,
the low elastic modulus layer is an ethylene-vinyl acetate copolymer resin or an ethylene-butyl acrylate copolymer resin,
an ethylene content rate of the ethylene-vinyl acetate copolymer resin or the ethylene-butyl acrylate copolymer resin is from 50 to 80% by weight, and
the mask material layer is an ethylene-vinyl acetate copolymer resin or an ethylene-butyl acrylate copolymer resin:
(a) a step of grinding the backing-face of a semiconductor wafer which has been laminated with a mask-integrated surface protective film according to claim 1 on a patterned surface side; laminating a wafer fixing tape on the backing-face side of the ground semiconductor wafer; and supporting and fixing the wafer to a ring flame;
(b) a step of peeling the substrate film from the mask-integrated surface protective film thereby to expose the mask material layer on top, and forming an opening by cutting a portion of the mask material layer corresponding to a street of the semiconductor wafer with a laser; or a step of forming an opening at a street of the semiconductor wafer by a laser cutting of a portion of the mask-integrated surface protective film corresponding to the street of the semiconductor wafer, and exposing the mask material layer on top by peeling the substrate film from the mask-integrated surface protective film;

(c) a plasma-dicing step of segmentalizing the semiconductor wafer at the street with $SF_6$ plasma, and thereby for singulating the semiconductor wafer into semiconductor chips; and (d) an ashing step of removing the mask material layer with $O_2$ plasma.

4. The method according to claim 3, wherein the substrate film is a polystyrene resin, and wherein the lamination of the mask-integrated surface protective film on the side of the patterned surface of the semiconductor wafer in the above-described step (a) is a heat lamination within a range of 50° C. to 100° C.

5. A mask-integrated surface protective film, comprising:
a substrate film, and
a mask material layer provided on the substrate film,
wherein the mask material layer is an ethylene-vinyl acetate copolymer resin or an ethylene-butyl acrylate copolymer resin,
wherein the thickness of the mask material layer is 50 μm or less,
wherein the substrate film comprises a polystyrene resin, and
wherein ethylene content rate of the ethylene-vinyl acetate copolymer resin or ethylene-butyl acrylate copolymer resin is from 50 to 80% by weight.

6. The mask-integrated surface protective film according to claim 5,
wherein the substrate film is multilayered
wherein, of the substrate film, a layer placed at the distance farthest from the mask material layer is a high elastic modulus layer and a layer placed at the distance nearest from the mask material layer is a low elastic modulus layer, and
wherein the thickness of the mask material layer is 10 μm or less.

7. The mask-integrated surface protective film according to claim 6, wherein the low elastic modulus layer is an ethylene-vinyl acetate copolymer resin or an ethylene-butyl acrylate copolymer resin.

8. The mask-integrated surface protective film according to claim 5, which is used for a plasma dicing.

9. A method of making a semiconductor chip which comprises, the following steps (a) to (d), wherein the mask-integrated surface protective film has a substrate film and a mask material layer provided on the substrate film, and the thickness of the mask material layer is 50 μm or less, the mask material layer is an ethylene-vinyl acetate copolymer resin or an ethylene-butyl acrylate copolymer resin, and the ethylene content rate of the ethylene-vinyl acetate copolymer resin or the ethylene-butyl acrylate copolymer resin is from 50 to 80% by weight:

(a) a step of grinding the backing-face of a semiconductor wafer which has been laminated with a mask-integrated surface protective film according to claim 1 on a patterned surface side; laminating a wafer fixing tape on the backing-face side of the ground semiconductor wafer; and supporting and fixing the wafer to a ring flame;

(b) a step of peeling the substrate film from the mask-integrated surface protective film thereby to expose the mask material layer on top, and forming an opening by cutting a portion of the mask material layer corresponding to a street of the semiconductor wafer with a laser; or a step of forming an opening at a street of the semiconductor wafer by a laser cutting of a portion of the mask-integrated surface protective film corresponding to the street of the semiconductor wafer, and exposing the mask material layer on top by peeling the substrate film from the mask-integrated surface protective film;

(c) a plasma-dicing step of segmentalizing the semiconductor wafer at the street with $SF_6$ plasma, and thereby for singulating the semiconductor wafer into semiconductor chips; and (d) an ashing step of removing the mask material layer with $O_2$ plasma.

10. The method according to claim 9,
wherein the substrate film is a polystyrene resin, and
wherein the lamination of the mask-integrated surface protective film on the side of the patterned surface of the semiconductor wafer in the above-described step (a) is a heat lamination within a range of 50° C. to 100° C.

11. The method according to claim 9,
wherein the substrate film is multilayered
wherein, of the substrate film, a layer placed at the distance farthest from the mask material layer is a high elastic modulus layer and a layer placed at the distance nearest from the mask material layer is a low elastic modulus layer, and
wherein the thickness of the mask material layer is 10 μm or less.

12. The method according to claim 11, wherein the low elastic modulus layer is an ethylene-vinyl acetate copolymer resin or an ethylene-butyl acrylate copolymer resin.

\* \* \* \* \*